(12) United States Patent
Peng et al.

(10) Patent No.: US 10,580,948 B2
(45) Date of Patent: Mar. 3, 2020

(54) LIGHT SOURCE MODULE

(71) Applicant: Lite-On Technology Corporation, Taipei (TW)

(72) Inventors: Yao-Chi Peng, Taipei (TW); Tsan-Li Chiu, Taipei (TW); Po-Chang Li, Taipei (TW); Ming-Hung Chien, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 15/884,295

(22) Filed: Jan. 30, 2018

(65) Prior Publication Data

US 2018/0351055 A1 Dec. 6, 2018

(30) Foreign Application Priority Data

Jun. 6, 2017 (CN) .......................... 2017 1 0416788

(51) Int. Cl.

| | |
|---|---|
| *H01L 33/56* | (2010.01) |
| *H01L 33/48* | (2010.01) |
| *H01L 33/50* | (2010.01) |
| *H01L 33/58* | (2010.01) |
| *H01L 33/60* | (2010.01) |
| *H01L 33/54* | (2010.01) |

(52) U.S. Cl.
CPC ............ *H01L 33/56* (2013.01); *H01L 33/483* (2013.01); *H01L 33/502* (2013.01); *H01L 33/505* (2013.01); *H01L 33/507* (2013.01); *H01L 33/54* (2013.01); *H01L 33/58* (2013.01); *H01L 33/60* (2013.01); *H01L 33/486* (2013.01); *H01L 2933/005* (2013.01); *H01L 2933/0041* (2013.01); *H01L 2933/0058* (2013.01); *H01L 2933/0091* (2013.01)

(58) Field of Classification Search
None
See application file for complete search history.

(56) References Cited

U.S. PATENT DOCUMENTS

| | | | |
|---|---|---|---|
| 2003/0143780 A1* | 7/2003 | Shirasaka | ......... B29C 45/14073 438/125 |
| 2003/0176014 A1* | 9/2003 | Hofmann | ............... B82Y 10/00 438/106 |
| 2004/0104391 A1* | 6/2004 | Maeda | ................. C09K 11/025 257/79 |

(Continued)

FOREIGN PATENT DOCUMENTS

| | | |
|---|---|---|
| CN | 101369614 | 2/2009 |
| CN | 101431134 | 4/2011 |

(Continued)

OTHER PUBLICATIONS

"Office Action of China Counterpart Application," dated Nov. 12, 2019, p. 1-p. 5.

*Primary Examiner* — Anthony Ho
*Assistant Examiner* — Kevin Quinto
(74) *Attorney, Agent, or Firm* — JCIPRNET

(57) ABSTRACT

A light source module including a substrate, an LED package, an optical cover, and at least one packing layer is provided. The LED package is disposed on the substrate and includes an encapsulant. The optical cover is disposed above the LED package. The at least one packing layer is filled between the LED package and the optical cover.

12 Claims, 7 Drawing Sheets

(56) References Cited

U.S. PATENT DOCUMENTS

| | | | |
|---|---|---|---|
| 2004/0264192 A1* | 12/2004 | Nagata | F21K 9/00 |
| | | | 362/267 |
| 2008/0064131 A1* | 3/2008 | Chang | G02F 1/133603 |
| | | | 438/29 |
| 2008/0128735 A1 | 6/2008 | Yoo et al. | |
| 2010/0041169 A1* | 2/2010 | Lee | B29C 35/0888 |
| | | | 438/26 |
| 2010/0321952 A1* | 12/2010 | Coleman | F21S 8/04 |
| | | | 362/607 |
| 2014/0191653 A1* | 7/2014 | Edmond | H05B 33/22 |
| | | | 313/512 |
| 2015/0145406 A1* | 5/2015 | Li | F21V 3/02 |
| | | | 313/502 |

FOREIGN PATENT DOCUMENTS

| | | |
|---|---|---|
| CN | 102227012 | 10/2011 |
| CN | 103887406 | 6/2014 |
| CN | 103915550 | 8/2016 |

\* cited by examiner

LIGHT SOURCE MODULE

CROSS REFERENCE TO RELATED APPLICATION

This application claims the priority benefit of China application serial no. 201710416788.8, filed on Jun. 6, 2017. The entirety of the above-mentioned patent application is hereby incorporated by reference herein and made a part of specification.

BACKGROUND OF THE INVENTION

Field of the Invention

The invention relates to a light source module, and in particular, a light source module that is water-proof and exhibits high light emission efficiency.

Description of Related Art

In the existing LED light source modules, an optical cover is mostly disposed at an outer side of an LED package, and an air layer exists between the LED package and the optical cover. The light pattern is adjusted through differences in refractive indexes and a curvature of the optical cover. Moreover, to satisfy the need for water-proofing, it is common to dispose an additional layer of water-proofing silicone between a substrate and the optical cover.

However, optical transmittance is suppressed by transmittance of the material itself and the Fresnel loss caused by an interface between air and the material, and light emission efficiency is limited accordingly. Moreover, although the water-proofing effect can be achieved by additionally providing the water-proofing silicone layer and assembling with screws, these also increase components constituting the light source module and complicate the assembly work.

SUMMARY OF THE INVENTION

The invention provides a light source module that provides effects of high light emission efficiency and water-proofing and is easy to assemble.

A light source module of the invention includes a substrate, an LED package, an optical cover, and at least one packing layer. The LED package includes an encapsulant and is disposed on the substrate. The optical cover is disposed above the LED package. The packing layer is filled between the LED package and the optical cover.

In an embodiment of the invention, a refractive index of the encapsulant is greater than a refractive index of the at least one packing layer, and the refractive index of the at least one packing layer is greater than or equal to a refractive index of the optical cover.

In an embodiment of the invention, wherein the at least one packing layer comprises diffuser particles, a percentage by weight of the diffuser particles is 0.1% to 20%, or wherein the at least one packing layer comprises phosphors, and a percentage by weight of the phosphors is 0.1% to 30%.

In an embodiment of the invention, wherein the at least one packing layer comprises a first packing layer and a second packing layer, and a difference between a refractive index of the first packing layer and a refractive index of the second packing layer is 0.05 to 0.5.

In an embodiment of the invention, wherein the first packing layer covers the LED package, and the second packing layer covers the first packing layer.

In an embodiment of the invention, wherein a refractive index of the first packing layer is greater than a refractive index of the second packing layer.

In an embodiment of the invention, wherein the second packing layer comprises diffuser particles or phosphors, a refractive index of the second packing layer is greater than a refractive index of the first packing layer, and the refractive index of the second packing layer is less than a refractive index of the encapsulant.

In an embodiment of the invention, further includes a blue light reflector coating film located on an inner surface or an outer surface of the at least one packing layer so as to reflect a blue light.

In an embodiment of the invention, further includes a yellow light reflector coating film located on an inner surface of the at least one packing layer comprising phosphors so as to reflect a yellow light.

In an embodiment of the invention, wherein an inner surface of the optical cover is a non-axisymmetric curved surface or an irregular curved surface.

A manufacturing method of light source module, includes providing a mold, wherein the mold comprises a first portion and a second portion, and the second portion comprises a cavity; disposing a LED package onto the first portion of the mold and combing the first portion to the second portion, so that the LED package extends into the cavity of the second portion; injecting a resin material to the cavity to cover the LED package; and curing the resin material to form a packing layer covering the LED package.

In an embodiment of the invention, wherein in a step of curing the resin material, further includes: heating the second portion of the mold.

In an embodiment of the invention, wherein the second portion is transparent, the resin material is a photocurable material, wherein a step of curing the resin material further includes irradiating light on the second portion of the mold.

In an embodiment of the invention, wherein in a step of combing the first portion to the second portion, further includes: applying a negative pressure on the cavity, such that the first portion tightly fits with the second portion.

In an embodiment of the invention, wherein a release layer covers in the cavity, after the resin material is cured so as to form the packing layer, the release layer is removed, so that the packing layer is separated from the second portion.

In light of the above, in the light source module of the invention, the packing layer is filled between the LED package and the optical cover. The refractive index differences between the packing layer, the LED package and the optical cover of the light source module of the invention are less than the refractive index differences between the air layer, the LED package and the optical cover of the conventional light source module, so the light source module of the invention has better optical efficiency and light pattern control efficiency. Since an air gap does not exist between the LED package and the optical cover in the light source module of the invention, the loss resulting from light passing an interface between the encapsulant and an air layer and an interface between the air layer and the optical cover as in the conventional light source module can be prevented, which thereby improves light emission efficiency and improves lighting quality. In addition, the packing layer covers the LED package and provides water-proofing and dust-proofing effects. Moreover, it is not necessary to additionally use screws for fixture, which saves assembly time and work. Furthermore, if the diffuser particles are added in the packing layer, the light emitted by the LED package is homogenized and thereby provides users with comfortable visual effect and thus prevents glare.

To provide a further understanding of the aforementioned and other features and advantages of the invention, exemplary embodiments, together with the reference drawings, are described in detail below.

DESCRIPTION OF THE EMBODIMENTS

Figure 1:
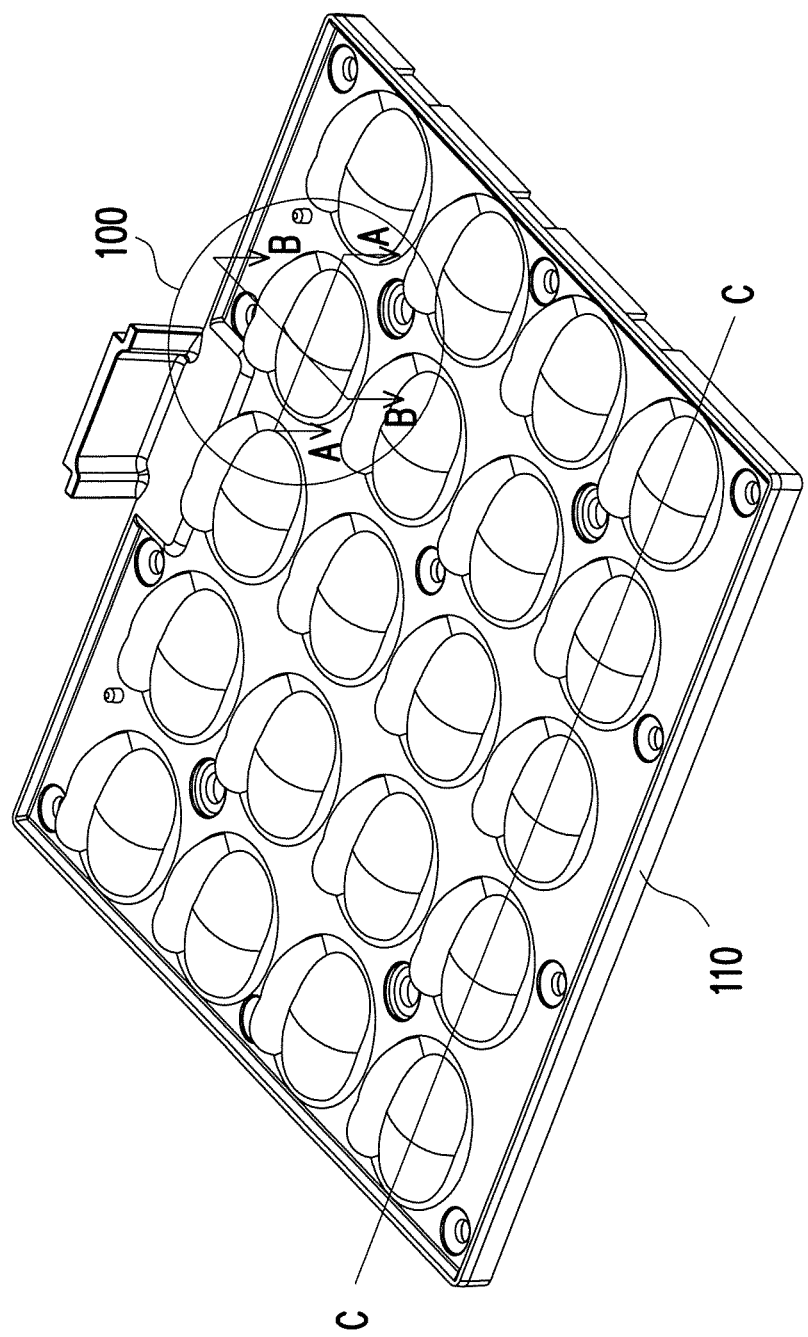
FIG. 1 is a schematic diagram illustrating a light source module according to an embodiment of the invention.

FIG. 1 is a schematic diagram illustrating a light source module according to an embodiment of the invention. Referring to FIG. 1, as an example, a plurality of light source modules 100 are arranged in a form of an array in FIG. 1 and are able to emit light in an array shape. Of course, in other embodiments, the light source modules 100 may be arranged in other forms and are not limited hereto. One of the light source modules 100 in FIG. 1 is taken as an example in the following to describe a structure of the light source module 100 in detail.

Figure 2:
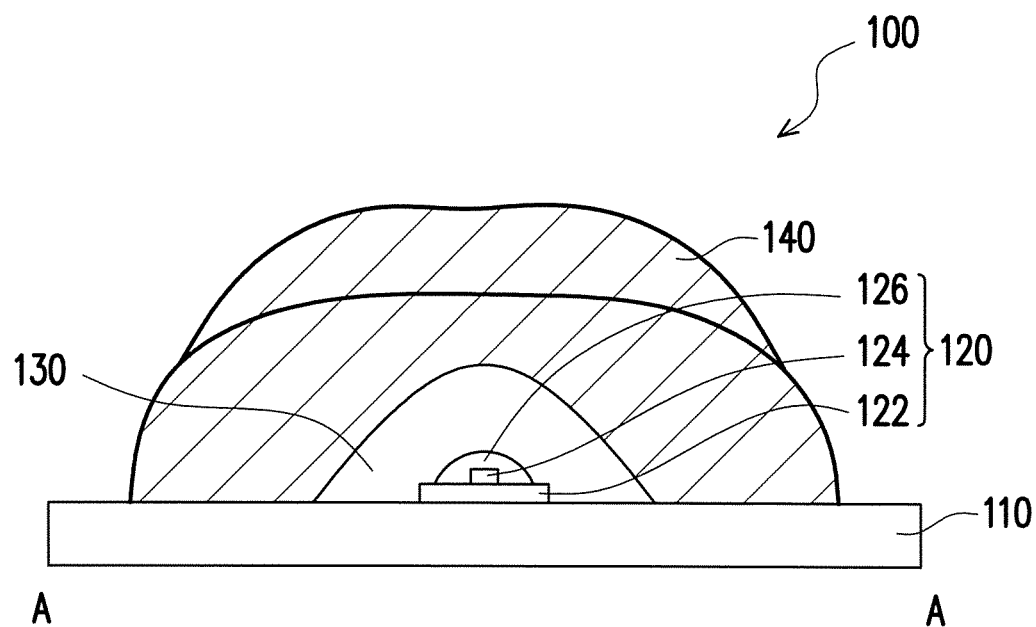
FIG. 2 is a cross-sectional schematic diagram along a line segment A-A of FIG. 1.

FIG. 2 is a cross-sectional schematic diagram along a line segment A-A of FIG. 1. Referring to FIG. 2, the light source module 100 of the present embodiment includes a substrate 110, an LED package 120, an optical cover 140, and at least one packing layer 130. In the present embodiment, the substrate 110 is any adequate circuit board such as an aluminum metal-core circuit board 110 on which a circuit (not illustrated) and an insulation layer (not illustrated) insulating the circuit and the substrate are disposed. The LED package 120 is disposed on the substrate 110 and is electrically connected to the circuit on the substrate 110. In the present embodiment, the LED package 120 includes a board body 122 including conductive patterns, an LED 124 disposed on the board body 122 and electrically connected to the board body 122, and an encapsulant 126 disposed on the board body 122 and encapsulating the LED 124.

The optical cover 140 is disposed above the LED package 120. In the present embodiment, the optical cover 140 is located at an outermost side and completely covers the LED package 120 to protect the LED package 120. Of course, in other embodiments, the optical cover 140 may partially cover the LED package 120.

Figure 3:
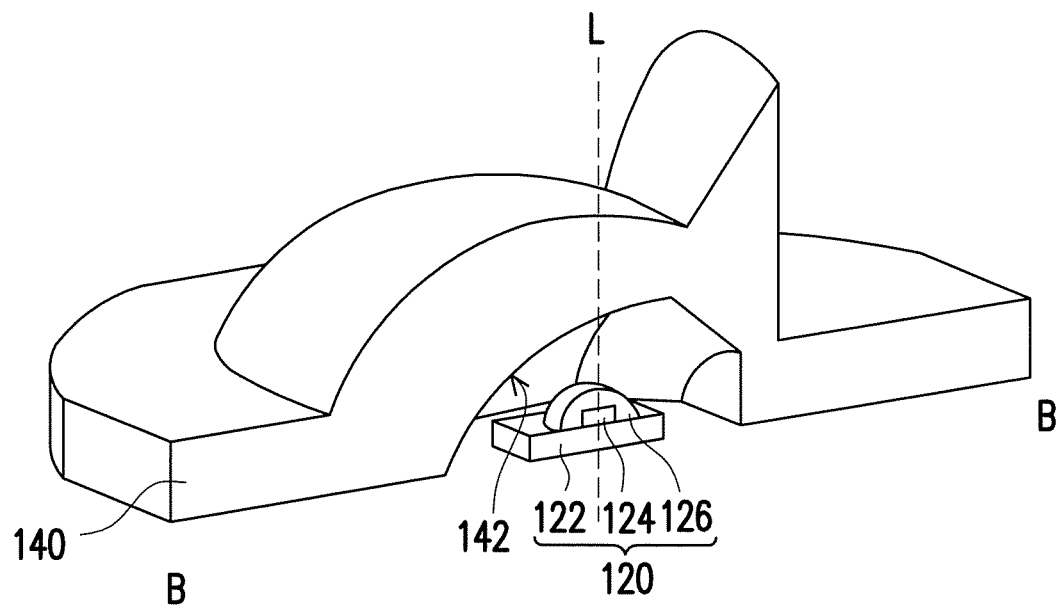
FIG. 3 is a cross-sectional schematic diagram along a line segment B-B of FIG. 1.

FIG. 3 is a cross-sectional schematic diagram along a line segment B-B of FIG. 1. It shall be noted that in FIG. 3, to illustrate a relative relationship between the optical cover 140 and the LED package 120 and a contour of an inner surface 142 of the optical cover 140, the substrate 110 and the packing layer 130 are not shown. Referring to FIG. 3, if, for example, a central position of the LED 124 of the LED package 120 is taken as an origin on an X-Y plane, and an axis L passing through the LED 124 of the LED package 120 is taken as a Z axis, in the present embodiment, the inner surface 142 of the optical cover 140 is a non-axisymmetric curved surface. As shown in FIG. 3, the inner surface 142 of the optical cover 140 is asymmetrical at left and right sides of the axis L. The optical cover 140 is able to provide more desirable optical effect through the specific curvature and shape.

It shall be explained that the opposite of the non-axisymmetric curved surface is an axisymmetric curved surface. In terms of the axisymmetric curved surface, a shape at two sides with respect to the axis is symmetrical (e.g., a spherical surface, a parabolic surface, a hyperboloid, or an elliptical surface). Therefore, the non-axisymmetric curved surface mentioned in the present embodiment is a non-spherical surface, a non-parabolic surface, a non-hyperboloid, and a non-elliptical surface. More specifically, the non-axisymmetric curved surface refers to a non-axisymmetric optical curved surface formed according to a specific mathematical equation. Of course, in other embodiments, the inner surface 142 of the optical cover 140 may be another curved surface such as an irregular optical curved surface formed according to a specific mathematical equation. As described below, the optical cover 140 may be formed by stacking through molding techniques. Alternatively, the optical cover 140 may be a-shaped hard layer, and in this case, the optical cover 140 includes a injection hole (not illustrated) for injecting a forming material of the packing layer 130.

Referring to FIG. 2 again, in the present embodiment, the light source module 100 includes a packing layer 130. The packing layer 130 fills between the LED package 120 and the optical cover 140. As clearly shown in FIG. 2, a gap between the LED package 120 and the optical cover 140 is filled up by the packing layer 130. Therefore, an air gap does not exist between the encapsulant 126 of the LED package 120 and the optical cover 140. Specifically, in the present embodiment, refractive indexes of the encapsulant 126, the packing layer 130, and the optical cover 140 vary gradually to achieve desirable transmission efficiency. For example, the refractive index of the encapsulant 126 is greater than the refractive index of the packing layer 130, and the refractive index of the packing layer 130 is greater than or equal to the refractive index of the optical cover 140. In the present embodiment, a material of the packing layer 130 is a resin such as a silicone or any other adequate material. The refractive indexes of the encapsulant 126, the packing layer 130, and the optical cover 140 are 1.4 to 1.7, and the refractive indexes of the encapsulant 126, the packing layer 130, and the optical cover 140 exhibit the foregoing variation relationship. Accordingly, the light source module 100 prevents the Fresnel loss resulting from light passing an interface between the encapsulant and an air layer and an interface between the air layer and the optical cover as in the conventional light source module and thereby improves light emission efficiency and improves lighting quality. Since the packing layer 130 covers the LED package 120, it provides water-proofing and dust-proofing effects. Moreover, it is not necessary to additionally use screws for fixture, which saves assembly time and work.

Table 1 compares three types of light source modules including: a light source module of numeral 1, which only includes the LED package 120; a light source module of numeral 2, which includes the LED package 120 and the optical cover 140 and has an air gap between the LED package 120 and the optical cover 140; and a light source module of numeral 3, which is the light source module 100 of FIG. 2, in which the packing layer 130 is filled between the LED package 120 and the optical cover 140 and an air gap does not exist. As clearly shown in Table 1, comparing the light source modules of numerals 1 and 2, in the case where only the optical cover 140 is disposed outside the LED package 120 (i.e., the air gap exists), a lumen value drops significantly. However, simultaneously comparing the light source modules of numerals 2 and 3, it is known that after the packing layer 130 is filled, the lumen value and a lens efficiency are both improved as compared to the case where the air gap exists.

TABLE 1

| Numeral/type | Drive current | Lumen | Lumen/ power | Lens efficiency |
| --- | --- | --- | --- | --- |
| 1/LED package only | 0.18 | 2245.65 | 185.93 | N/A |
| 2/LED package and optical cover (with air gap) | 0.18 | 2118.33 | 175.30 | 94.2% |
| 3/light source module of FIG. 2 (without air gap) | 0.18 | 2250.61 | 184.45 | 99.2% |

Of course, the form of the light source module is not limited to the description above. Other light source modules are provided in the description below. FIG. 4 to FIG. 8 are respectively cross-sectional schematic diagrams illustrating a number of types of light source modules according to other embodiments of the invention. It shall be noted that in the following embodiments, components identical or similar to those in the foregoing embodiment are labeled by the same or similar numerals and are not repeatedly described.

Figure 4:
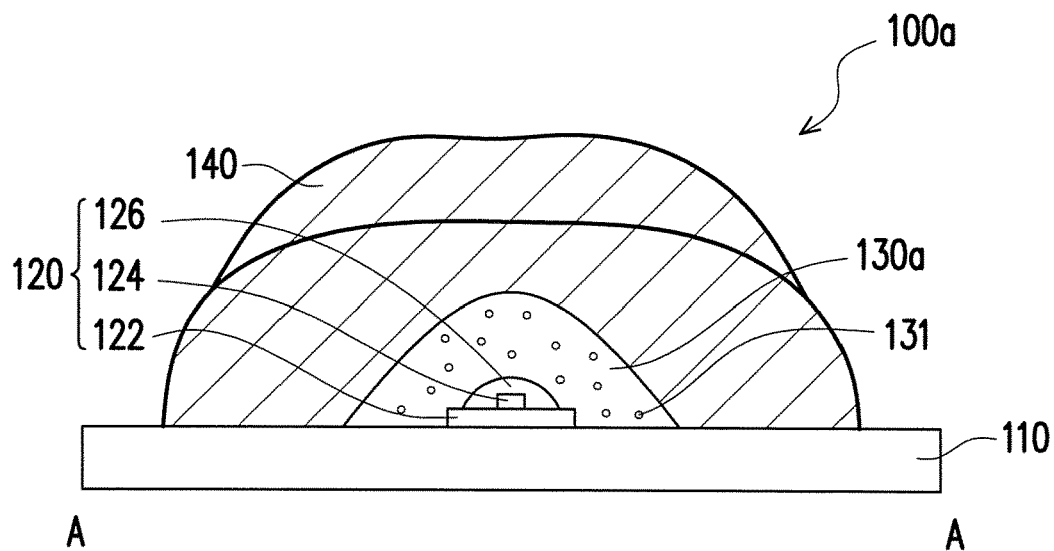
FIG. 4 to FIG. 8 are respectively cross-sectional schematic diagrams illustrating a number of types of light source modules according to other embodiments of the invention.

Referring to FIG. 4 first, the main difference between a light source module 100a of FIG. 4 and the light source module 100 of FIG. 2 lies in that in the present embodiment, a packing layer 130a is doped with particles 131 to provide specific optical effect. For example, the particles 131 doped in the packing layer 130 include diffuser particles used to homogenize light emitted by the LED package 120 and thereby provide users with comfortable visual effect, prevent glare, and control a light pattern.

It shall be mentioned that a difference in a concentration of the diffuser particles in the packing layer 130a has an impact on the visual effect of the emitted light. For example, a low concentration of the diffuser particles in the packing layer 130a leads to higher light transmission efficiency but insufficient diffusion effect; a high concentration of the diffuser particles in the packing layer 130a leads to higher diffusion effect but poor light transmission efficiency. In the present embodiment, a percentage by weight of the diffuser particles is 0.1% to 20% to achieve a desirable balance between transmission efficiency and diffusion effect. Moreover, in the present embodiment, the diffuser particles include organic diffusion materials such as acrylic, organosilicon, or polyethylene materials. The diffuser particles may also include inorganic diffusion materials such as nanobarium sulfate, silicon dioxide, or calcium carbonate. Of course, the type and percentage by weight of the diffuser particles are not limited to the description above.

Of course, the type of the particles 131 doped in the packing layer 130 is not limited to the diffuser particles. The particles 131 may also include a phosphor which is a photoluminescence material and is used for wavelength conversion of light. Similarly, the concentration percentage by weight of the phosphor is 0.1% to 30% to achieve a desirable balance between transmission efficiency and wavelength conversion. Moreover, in the present embodiment, the type of the phosphor is not particularly limited and is, for example, an aluminate phosphor, a silicate phosphor, a nitride phosphor, an oxynitride phosphor, a fluoride phosphor or any combination thereof.

In the invention, an embodiment including a plurality of packing layers is also provided. In this case, the refractive indexes of the encapsulant 126, the packing layer 130, and the optical cover 140 still vary gradually. However, refractive index relationships among the packing layers may be adjusted according to the needs, as illustrated in the example below.

Figure 5:
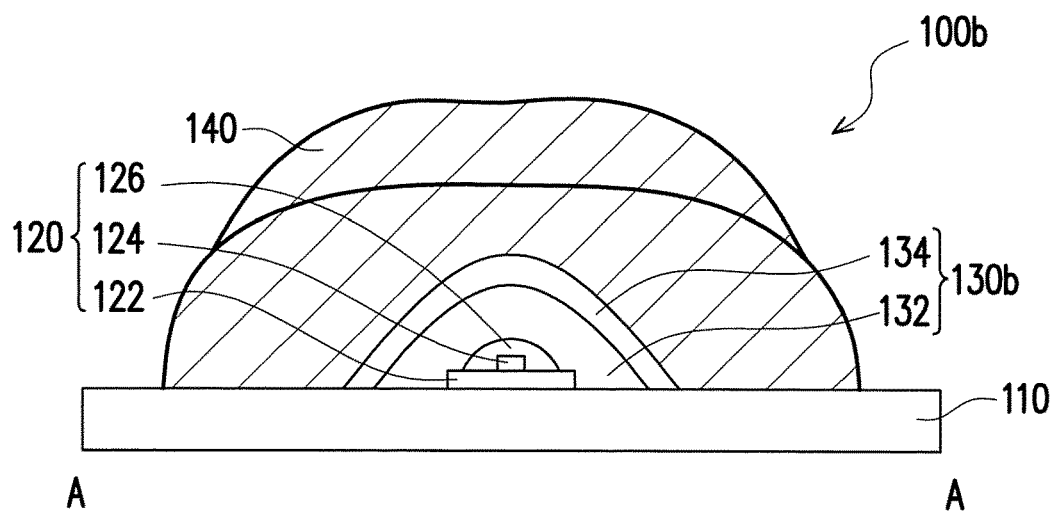

Referring to FIG. 5, the main difference between a light source module 100b of FIG. 5 and the light source module 100 of FIG. 2 lies in that in the present embodiment, at least one packing layer 130b includes a first packing layer 132 and a second packing layer 134. The first packing layer 132 covers the LED package 120, and the second packing layer 134 covers the first packing layer 132. In the present embodiment, a refractive index of the first packing layer 132 is greater than a refractive index of the second packing layer 134, and a difference between the refractive indexes of the first packing layer 132 and the second packing layer 134 is 0.05 to 0.5. Moreover, in the present embodiment, the refractive index of the encapsulant 126 is greater than the refractive index of the first packing layer 132 and the refractive index of the second packing layer 134, and the refractive index of the first packing layer 132 and the refractive index of the second packing layer 134 are greater than or equal to the refractive index of the optical cover 140.

Figure 6:
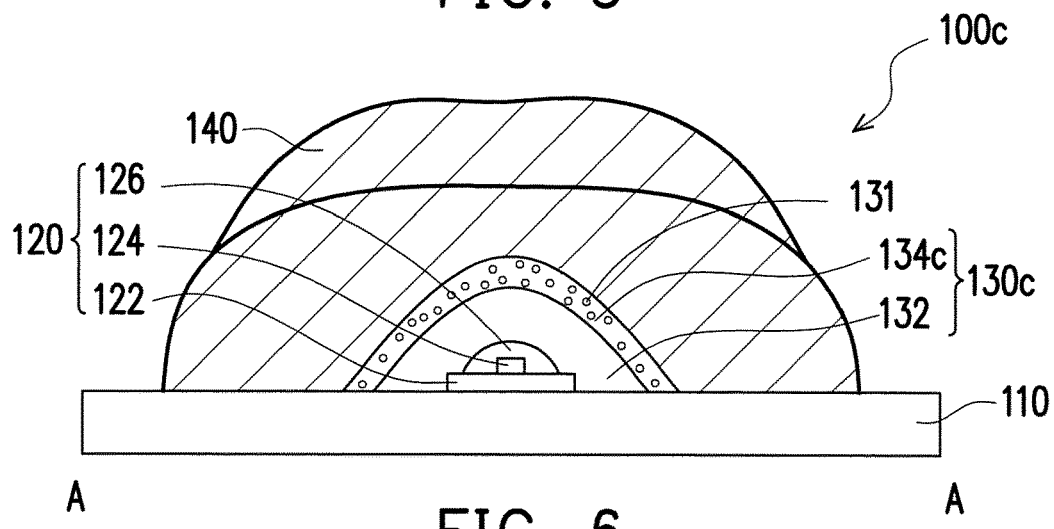
Figure 7:
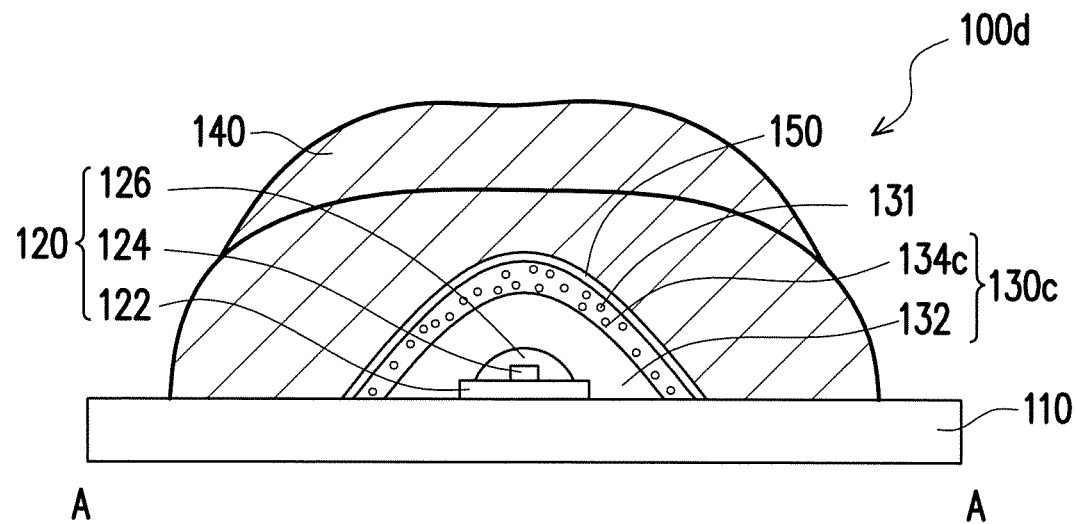

Referring to FIG. 6, the main difference between a light source module 100c of FIG. 6 and the light source module 100b of FIG. 5 lies in that the refractive index of the first packing layer 132 is smaller than a refractive index of a second packing layer 134c, and the second packing layer 134c is mixed with the particles 131. The particles are, for example, the diffuser particles that are able to homogenize the light emitted by the LED package 120 and thereby provide users with comfortable visual effect, prevent glare, and control a light pattern. Of course, the particles may be a phosphor that is able to convert a wavelength of light.

Figure 9:
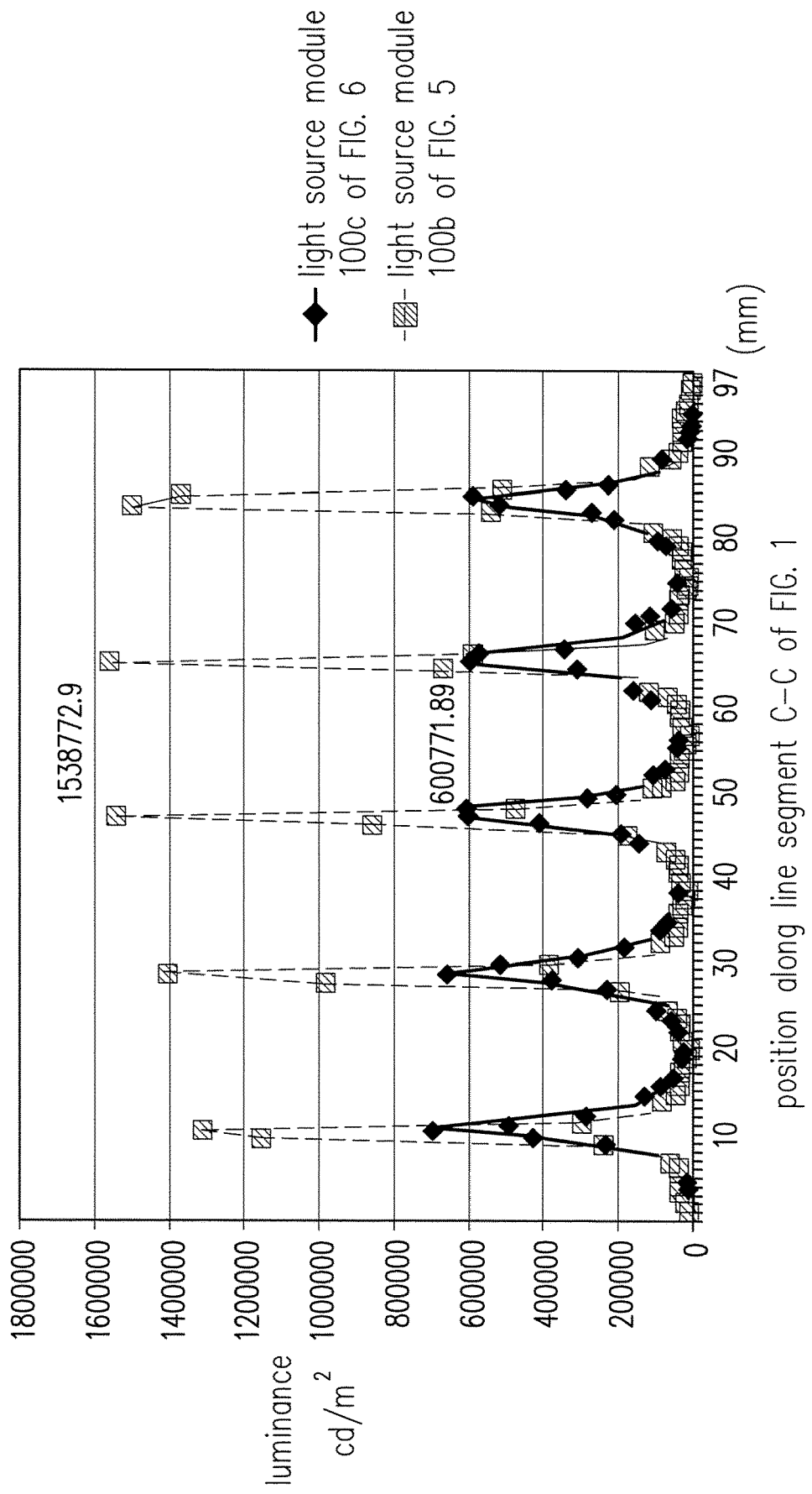
FIG. 9 is a diagram illustrating a relationship of positions and illuminances of light source modules of FIG. 5 and FIG. 6 as examples.

FIG. 9 is a diagram illustrating a relationship of positions and illuminances of the light source modules 100b, 100c of FIG. 5 and FIG. 6 as examples. Referring to FIG. 9, an X axis of FIG. 9 may be seen to indicate a position of the light source modules 100b, 100c of FIG. 5 and FIG. 6 along a line segment C-C of FIG. 1, and a Y axis indicates a luminance of light emitted by the light source modules 100b, 100c of FIG. 5 and FIG. 6. The light source module 100b of FIG. 5 is represented by broken lines, and the light source module 100c of FIG. 6 is represented by solid lines. Since the light source module 100c of FIG. 6 is doped with the diffuser particles in the second packing layer 134c, as clearly shown in FIG. 9, a difference in luminance (about 700000) of the row of light source modules 100c of FIG. 6 is obviously smaller than a difference in illuminance (about 1500000) of the row of light source modules 100b of FIG. 5. Since the difference in luminance of the row of light source modules 100c, which are doped with the diffuser particles in the second packing layer 134c, is obviously smaller, more desirable visual comfort is provided.

It shall be mentioned that since the second packing layer 134c of the light source module 100c of FIG. 6 is mixed with the particles 131, light may scatter toward the first packing layer 132 when passing the second packing layer 134c, such that the light emission efficiency of the second packing layer 134c is affected. To avoid the foregoing issue, in the light source module 100c of FIG. 6, a refractive index of the second packing layer 134c is greater than the refractive index of the first packing layer 132. If a portion of light in the second packing layer 134c is reflected by the particles 131 and is emitted toward the first packing layer 132, it is likely to be reflected in a total reflection manner at an interface between the first packing layer 132 and the second packing layer 134 back to the second packing layer 134. Therefore, arrangement that the refractive index of the second packing layer 134c is greater than the refractive index of the first packing layer 132 causes the light in the second packing layer 134 to be emitted more toward the optical cover 140, which thereby improves the light emission efficiency of the second packing layer 134.

Table 2 compares four light source modules including: a light source module of numeral 1, which has an air gap between the encapsulant and the optical cover (i.e., the conventional light source module); a light source module of numeral 2, in which the first packing layer 132 and the second packing layer 134 are filled between the encapsulant 126 and the optical cover 140, and the refractive index of the first packing layer 132 is greater than the refractive index of the second packing layer 134, as in the light source module 100b of FIG. 5; a light source module of numeral 3, in which 10% of the diffuser particles are mixed in the second packing layer 134 of the light source module 100b of FIG. 5; and a light source module of numeral 4, in which the refractive index of the first packing layer 132 is smaller than the refractive index of the second packing layer 134c, and 10% of the diffuser particles are mixed in the second packing layer 134c, as in the light source module 100c of FIG. 6. Comparing the light source modules of numerals 1 and 2, it is known that after the packing layer 130b is filled between the encapsulant 126 and the optical cover 140 of the light source module 100b of numeral 2, the transmittance is significantly improved by 6%. Comparing the light source modules of numerals 3 and 4, it is known that when the diffuser particles are added into the second packing layer 134 and the refractive index of the second packing layer 134c is designed to be greater than the refractive index of the first packing layer 132, then the light emission efficiency is improved by 2%.

TABLE 2

| Numeral/ type of light source module | Refractive index of encapsulant | Refractive index of first packing layer | Refractive index of second packing layer | Refractive index of optical cover | Light emission efficiency |
|---|---|---|---|---|---|
| 1/ conventional light source module | 1.6 | air (about 1) | | 1.43 | 89% |
| 2/ light source module of FIG. 5 | | 1.59 | 1.45 | | 95% |
| 3 | | 1.59 | 1.45, mixed with 10% of diffuser particles | | 78% |
| 4/ light source module of FIG. 6 | | 1.45 | 1.59, mixed with 10% of diffuser particles | | 80% |

Referring back to FIG. 7, the main difference between a light source module 100d of FIG. 7 and the light source module 100c of FIG. 6 lies in that the light source module 100d further includes an optical filter coating film 150, preferably located on the inner surface of the optical cover 140 (i.e., an outer surface of a packing layer 130c), to filter blue light/UV light (e.g., light having a wavelength smaller than 460 nm), such that blue light/UV light does not pass out of the packing layer 130c, and the possibility of affecting eye health of the users due to the blue light/UV light emitted by the light source module 100d is lowered. However, in other embodiments, the optical filter coating film 150 may also be located on an outer surface of the LED package 120 (i.e., an inner surface of the packing layer 130c) or located between the first packing layer 132 and the second packing layer 134c.

Figure 8:
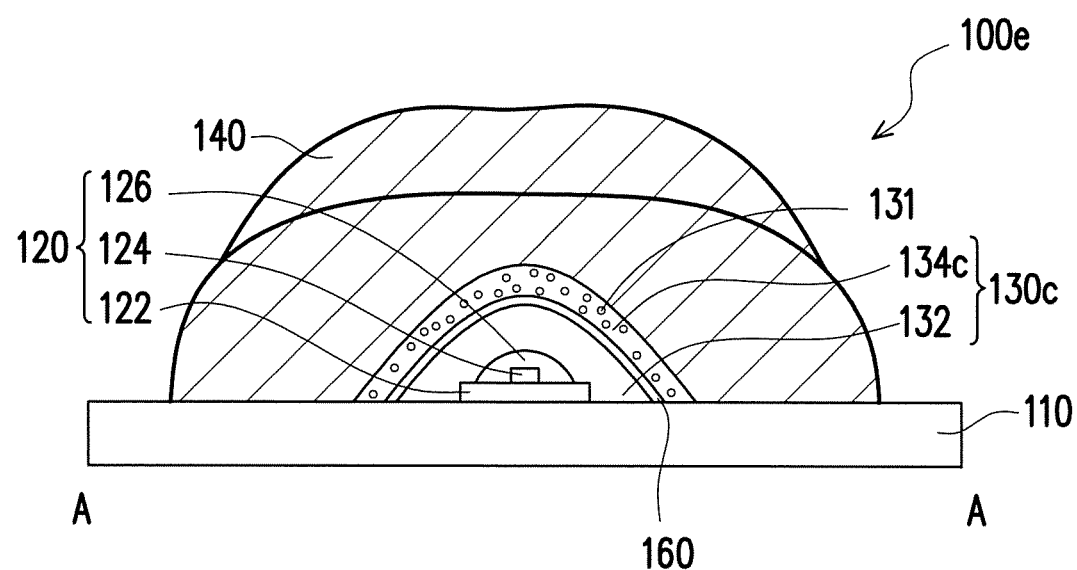

Referring to FIG. 8, the main difference between a light source module 100e of FIG. 8 and the light source module 100c of FIG. 6 lies in that the particles of the second packing layer 134c of the packing layer 130c are a phosphor, for example, and the light source module 100e further includes a reflective coating film 160, and preferably includes a reflective coating film capable of reflecting a wavelength greater than 500 nm. The reflective coating film 160 is located on the inner surface of the at least one packing layer 130. More specifically, the reflective coating film 160 is located on an inner surface of the first packing layer 132 to reflect yellow light outward to adjust a light color temperature emitted by the light source module 100e.

Of course, in other unillustrated embodiments, the optical filter coating film 150 or/and the reflective coating film 160 may also be applied to the light source modules 100, 100a, 100b of FIG. 2, FIG. 4, and FIG. 5 or other unillustrated light source modules and are not limited to the description above.

A manufacturing method of the light source module 100 is provided below. FIG. 10 to FIG. 13 are schematic diagrams illustrating a procedure of a manufacturing method of the light source module 100 according to an embodiment of the invention. In the present embodiment, the light source module 100 of FIG. 2 is taken as an example to describe a method of forming the packing layer 130 on the LED package 120. Of course, in other embodiments, the manufacturing method of the packing layer 130 is not limited hereto.

Figure 10:
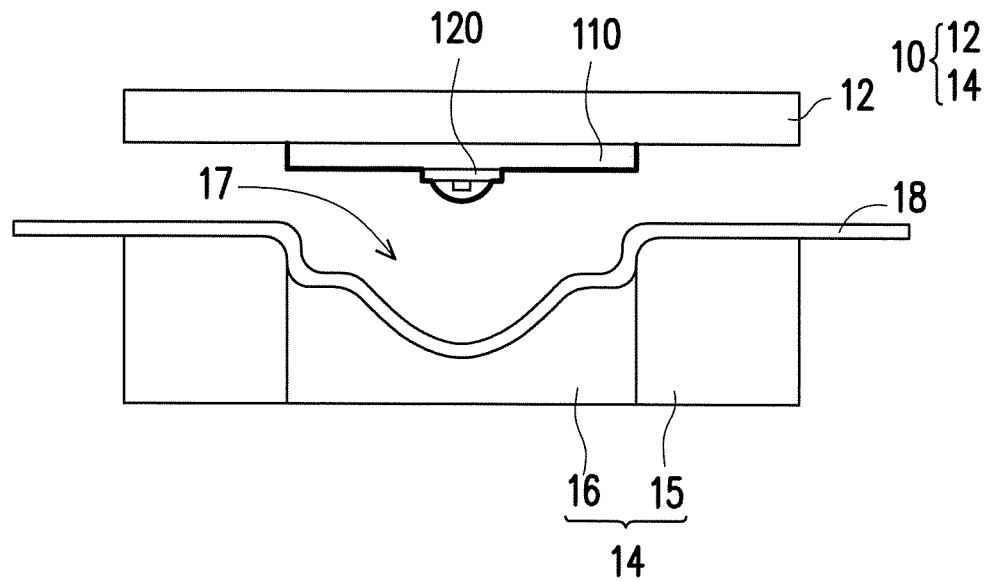
FIG. 10 to FIG. 13 are schematic diagrams illustrating a procedure of a manufacturing method of a light source module according to an embodiment of the invention.

Referring to FIG. 10 first, a mold 10 is provided first, wherein the mold 10 includes a first portion 12 and a second portion 14 separate from each other. The LED package 120 along with the substrate 110 is fixed on the first portion 12 of the mold 10. The second portion 14 includes a cavity 17. In the present embodiment, the second portion 14 includes a fixing part 15 and a moving part 16 that moves relatively to the fixing part 15. The cavity 17 is formed on the moving part 16. Of course, the present embodiment only shows one form of the mold 10, and the form of the mold 10 applicable to this method is not limited hereto. Moreover, as shown in FIG. 10, before the first portion 12 is combined to the second portion 14, a release layer 18 covers in the cavity 17 for a subsequent release. Of course, in other embodiments, if the light source module 100 can be easily separated from the mold 10, the release layer 18 may be omitted.

Figure 11:
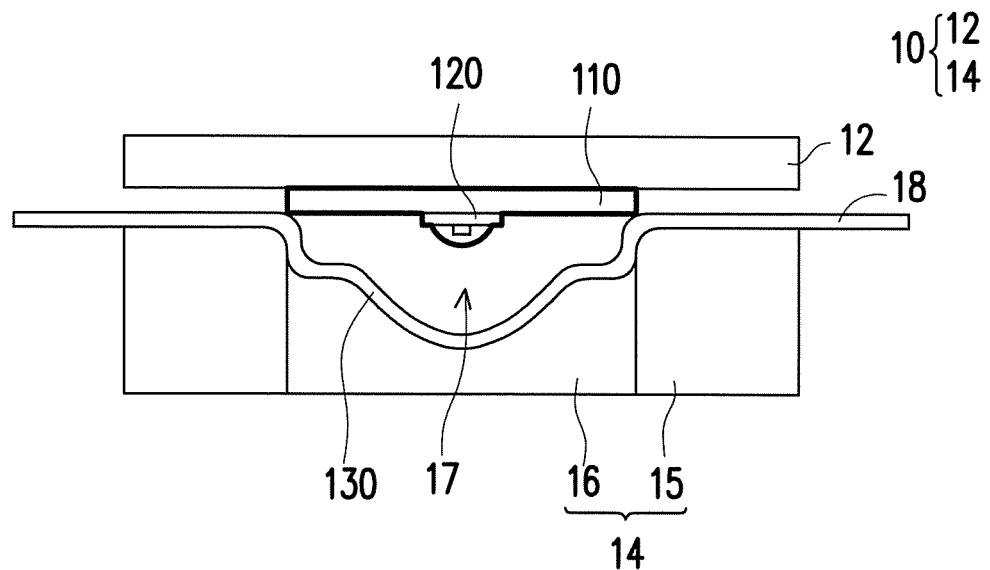
Figure 12:
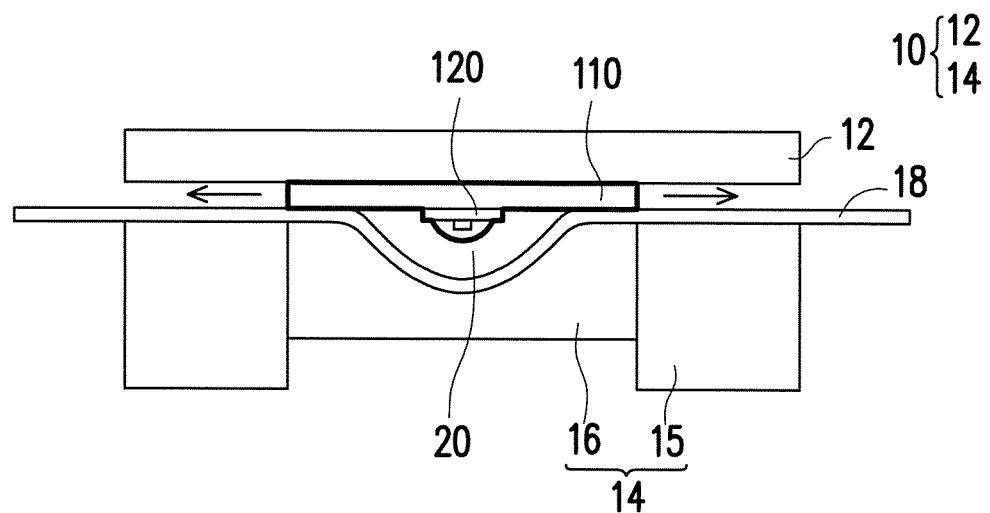

Next, as shown in FIG. 11, the first portion 12 is combined to the second portion 14, and the LED package 120 located on the first portion 12 reaches into the cavity 17 of the second portion 14. In the present embodiment, a method of combining the first portion 12 to the second portion 14, as shown in FIG. 12, involves applying a negative pressure on the cavity 17, such that the first portion 12 tightly fits with the second portion 14. Since a pressure in the cavity 17 is reduced, the moving part 16 moves upward relatively to the fixing part 15 until the moving part 16 is stopped by the substrate 110 and cannot continue moving upward. Before or after the moving part 16 moves to a predetermined position, an operator injects a resin material 20 into a space between the release layer 18 and the substrate 110 to cover the LED package 120. In the present embodiment, a material of the polymeric material 20 is, for example, silicone or any material having a refractive index of 1.4 to 1.7. Of course, in other embodiments, if the first portion 12 can be directly tightly combined with the second portion 14, the step of applying the negative pressure on the cavity 17 may also be omitted. Moreover, in other embodiments, the moving part 16 of the second portion 14 may be designed to be unable to move relatively to the fixing part 15. In other words, the second portion 14 may also be a single component that does not deform.

Figure 13:
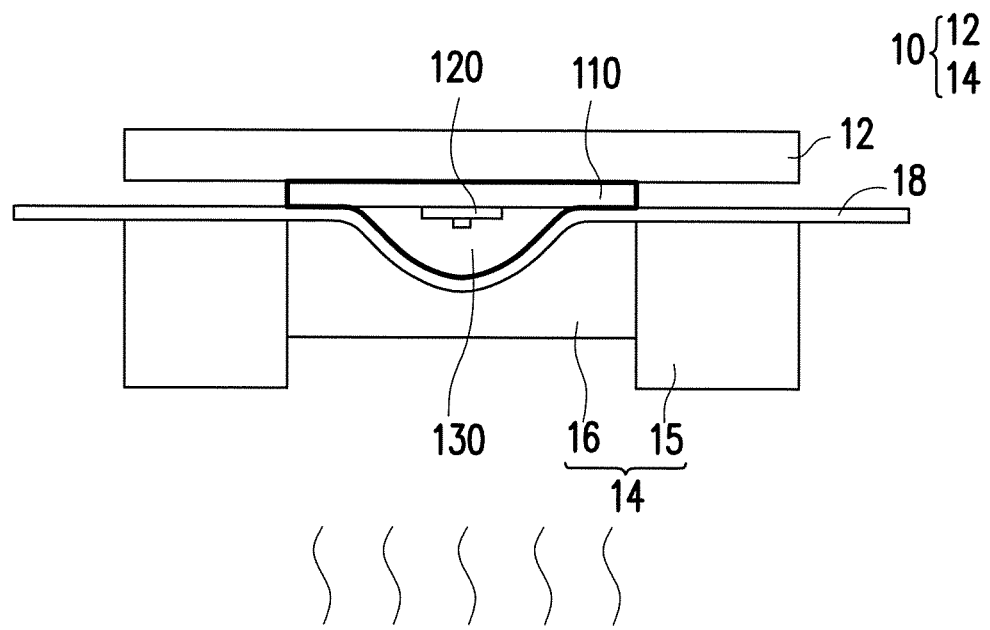

Next, as shown in FIG. 13, the resin material 20 is cured to form a resin layer (i.e., the packing layer 130) covering the LED package 120. In the present embodiment, the resin material 20 is, for example, a material that is curable by heat. Therefore, the resin material 20 can be cured by heating the second portion 14 of the mold 10 to form the packing layer 130. However, in other embodiments, the resin material 20 may be a photocurable material such as a UV curable material. When the resin material 20 is a photocurable material, the second portion 14 of the mold 10 has to be light transmittable (e.g., transparent), so that the resin material 20 can be cured by irradiating light on the second portion 14 of the mold 10 to form the packing layer 130 and complete the step of forming the packing layer 130 on the substrate 110 and covering the LED package 120. Next, the substrate 110 is removed from the first portion 12 and the release layer 18 is removed such that the packing layer 130 is separated from the second portion 14 and is released from the mold 10. A half-finished product including the packing layer 130 is formed. It shall be explained that in the case where multiple layers of the packing layer 130 are included, molding can be repeated to form a half-finished product of multiple layers of the packing layer 130. Finally, molding is performed on the half-finished product including the packing layer 130 to form the optical cover 140 and eventually form the light source module of the invention.

In addition to the foregoing method of directly molding the optical cover 140, the invention may also adopt a hard optical cover 140. Namely, an optical cover 140 including a resin material injection hole is provided. After the substrate 110 including the LED package 120 is directly aligned and attached with the optical cover 140, the resin material 20 is injected through the resin material injection hole and is cured to form the light source module including the single-layer packing layer 130. Alternatively, after the foregoing half-finished product including the N-layer packing layer 130 is aligned and attached with the optical cover 140, the resin material 20 is injected through the resin material injection hole and is cured to form the light source module including a (N+1)-layer packing layer 130.

In summary of the above, in the light source module of the invention, the packing layer is filled between the LED package and the optical cover. The refractive index differences between the packing layer, the LED package and the optical cover of the light source module of the invention are less than the refractive index differences between the air layer, the LED package and the optical cover of the conventional light source module, so the light source module of the invention has better optical efficiency and light pattern control efficiency. Since an air gap does not exist between the LED package and the optical cover in the light source module of the invention, the Fresnel loss resulting from light passing the interface between the encapsulant and the air layer and the interface between the air layer and the optical cover as in the conventional light source module can be prevented, which thereby improves light emission efficiency and improves lighting quality. Moreover, the packing layer covers the LED package and provides water-proofing and dust-proofing effects. Moreover, it is not necessary to additionally use screws for fixture, which saves assembly time and work. Furthermore, if the diffuser particles are added in the packing layer, the light emitted by the LED package is homogenized and thereby provides the users with comfortable visual effect and prevents glare.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A light source module comprising:
 a substrate;
 an LED package disposed on the substrate, the LED package comprising an encapsulant;
 an optical cover disposed above the LED package; and
 at least one packing layer filled between the LED package and the optical cover, wherein the at least one packing layer comprises a first packing layer and a second packing layer, the first packing layer covers the LED package, the second packing layer covers the first packing layer, the second packing layer comprises diffuser particles or phosphors, a refractive index of the second packing layer is greater than a refractive index of the first packing layer, and the refractive index of the second packing layer is less than a refractive index of the encapsulant.

2. The light source module according to claim 1, wherein the refractive index of the second packing layer is greater than or equal to a refractive index of the optical cover.

3. The light source module according to claim 1, wherein an air gap does not exist between the LED package and the optical cover.

4. The light source module according to claim 1, wherein a percentage by weight of the diffuser particles is 0.1% to 20%.

5. The light source module according to claim 1, wherein a percentage by weight of the phosphors is 0.1% to 30%.

6. The light source module according to claim 1, wherein a difference between a refractive index of the first packing layer and a refractive index of the second packing layer is 0.05 to 0.5.

7. The light source module according to claim 1, further comprising:
 a blue light reflector coating film located on an inner surface or an outer surface of the at least one packing layer so as to reflect a blue light.

8. The light source module according to claim 1, further comprising:
 a yellow light reflector coating film located on an inner surface of the at least one packing layer comprising phosphors so as to reflect a yellow light.

9. The light source module according to claim 1, wherein an inner surface of the optical cover is a non-axisymmetric curved surface or an irregular curved surface.

10. A manufacturing method of light source module, comprising:
 providing an optical cover having a resin material injection hole;
 aligning and attaching a substrate having a LED package with the optical cover, wherein the LED package comprises an LED and an encapsulant encapsulating the LED;

injecting a first resin material through the resin material injection hole into the optical cover to cover the LED package;

curing the first resin material to form a first packing layer covering the LED package, wherein the first packing layer covers the encapsulant;

injecting a second resin material through the resin material injection hole into the optical cover to cover the first packing layer; and curing the second resin material to form a second packing layer covering the first packing layer, wherein the first packing layer is located between the encapsulant and the second packing layer, wherein the second packing layer comprises diffuser particles or phosphors, a refractive index of the second packing layer is greater than a refractive index of the first packing layer, and the refractive index of the second packing layer is less than a refractive index of the encapsulant.

11. The manufacturing method of light source module according to claim 10, wherein the optical cover is transparent, the first resin material is a photocurable material, wherein in a step of curing the first resin material further comprises irradiating light on the optical cover.

12. The manufacturing method of light source module according to claim 10, wherein the optical cover is transparent, the second resin material is a photocurable material, wherein in a step of curing the second resin material further comprises irradiating light on the optical cover.

* * * * *